United States Patent
Lee et al.

(10) Patent No.: US 9,349,787 B1
(45) Date of Patent: May 24, 2016

(54) INTEGRATED CIRCUITS WITH CAPACITORS AND METHODS OF PRODUCING THE SAME

(71) Applicant: GLOBALFOUNDRIES, Inc., Grand Cayman (KY)

(72) Inventors: Ki Young Lee, Schenectady, NY (US); Sanggil Bae, Clifton Park, NY (US); Tony Joung, Watervliet, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/699,083

(22) Filed: Apr. 29, 2015

Related U.S. Application Data
(60) Provisional application No. 62/090,132, filed on Dec. 10, 2014.

(51) Int. Cl.
  *H01L 21/768* (2006.01)
  *H01L 23/522* (2006.01)
  *H01L 49/02* (2006.01)
(52) U.S. Cl.
  CPC .......... *H01L 28/60* (2013.01); *H01L 21/76877* (2013.01); *H01L 23/5226* (2013.01)
(58) Field of Classification Search
  CPC ........... H01L 2224/73265; H01L 2924/13091; H01L 33/62; H01L 2224/16225; H01L 24/43; H01L 2924/19041
  See application file for complete search history.

(56) References Cited

U.S. PATENT DOCUMENTS

| | | | |
|---|---|---|---|
| 5,576,240 | A | 11/1996 | Radosevich et al. |
| 5,918,135 | A | 6/1999 | Lee et al. |
| 6,166,423 | A | 12/2000 | Gambino et al. |
| 6,333,224 | B1 | 12/2001 | Lee |
| 6,461,914 | B1 | 10/2002 | Roberts et al. |
| 6,479,850 | B2 | 11/2002 | Lee |
| 6,649,464 | B2 | 11/2003 | Lee |
| 6,853,003 | B2 | 2/2005 | Lee |
| 6,881,999 | B2 | 4/2005 | Lee et al. |
| 7,232,736 | B2 | 6/2007 | Lee |
| 7,239,004 | B2 | 7/2007 | Park et al. |
| 7,462,535 | B2 | 12/2008 | Lee et al. |
| 7,517,763 | B2 | 4/2009 | Park et al. |
| 8,623,735 | B2 | 1/2014 | Lee et al. |
| 2009/0090998 | A1* | 4/2009 | Woo ....................... H01L 21/768 257/532 |
| 2013/0065375 | A1* | 3/2013 | Lee ..................... H01L 23/5223 438/381 |

* cited by examiner

*Primary Examiner* — Marc Armand
*Assistant Examiner* — Shannon Yi
(74) *Attorney, Agent, or Firm* — Ingrassia Fisher & Lorenz, P.C.

(57) ABSTRACT

Integrated circuits and methods for producing the same are provided. A method for producing an integrated circuit includes forming a capacitor trench through a dielectric layer, and forming a base layer overlying the dielectric layer and within the capacitor trench. A base layer via gap is formed in the base layer, where the base layer via gap is positioned overlying the dielectric layer and the first contact. A base plate and a shield are formed from the base layer, where the base plate is within the capacitor trench. A capacitor insulating layer is formed overlying the base plate, the base layer, and within the base layer via gap, and a via is formed through the base layer via gap. A second contact and a top plate are simultaneously formed, where the second contact is formed in the via and the top plate is formed in the capacitor trench.

20 Claims, 7 Drawing Sheets

INTEGRATED CIRCUITS WITH CAPACITORS AND METHODS OF PRODUCING THE SAME

CROSS-REFERENCE TO RELATED APPLICATION

This Application claims the benefit of priority to U.S. Provisional Application Ser. No. 62/090,132, which was filed on Dec. 10, 2014, the contents of which are incorporated herein by reference in their entirety.

TECHNICAL FIELD

The technical field generally relates to integrated circuits with capacitors and methods of producing the same, and more particularly relates to integrated circuits with metal/insulator/metal capacitors and methods of producing the same.

BACKGROUND

The semiconductor industry is continuously moving toward the fabrication of smaller and more complex microelectronic components with higher performance. Capacitors are used in many integrated circuits for storing data, such as for dynamic random access memory. Capacitors are also used for many analog to digital or digital to analog conversions, as well as many other purposes. Metal/insulator/metal (MIM) capacitors are desirable because they are stable over a range of applied voltages and temperatures. MIM capacitors have metallic base and top plates separated by an insulator. A nearby metallic shield can reduce "noise" and interference from nearby electronic components, and the metallic shield becomes more important as the size of semiconductors becomes smaller with closer packing of the electronic components.

Transistors or other electronic components are also used in many integrated circuits, and the transistors, capacitors, and other electronic components are interconnected in various ways for desired purposes. Vertical contacts are typically formed through insulating layers, and horizontal interconnects are formed within an insulating layer to electrically connect different components. Contacts, interconnects, and capacitors use conductive materials, and the same material can be used for each these components. More efficient manufacturing methods for the production of electronic components can reduce costs and improve manufacturing rates.

Accordingly, it is desirable to provide integrated circuits and methods of producing integrated circuits with contacts, interconnects, and capacitors that are simultaneously formed to reduce manufacturing costs and improve manufacturing efficiencies. In addition, it is desirable to provide integrated circuits and methods of producing integrated circuits that simultaneously produce contacts, interconnects, and capacitors with metallic shields that isolate the capacitors and thereby reduce noise during circuit operations. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming a capacitor trench through a dielectric layer, and forming a base layer overlying the dielectric layer and within the capacitor trench. A base layer via gap is formed in the base layer, where the base layer via gap is positioned overlying the dielectric layer and the first contact. A base plate and a shield are formed from the base layer, where the base plate is within the capacitor trench. A capacitor insulating layer is formed overlying the base plate, the base layer, and within the base layer via gap, and a via is formed through the base layer via gap. A second contact and a top plate are simultaneously formed, where the second contact is formed in the via and the top plate is formed in the capacitor trench.

A method for producing an integrated circuit is provided in another embodiment. A capacitor trench is formed through a dielectric layer, and a base layer is formed overlying the dielectric layer within the capacitor trench. The base layer is removed at a base plate gap within the capacitor trench to form a base plate and a shield from the base layer, where the base plate gap is defined between the base plate and the shield. The shield is electrically isolated from the base plate, extends horizontally from the base plate and bends at a shield bend point. A capacitor insulating layer is formed overlying the base plate and the base layer, and a top plate is formed overlying the base plate such that the capacitor insulating layer is positioned between the top plate and the base plate.

An integrated circuit is provided in yet another embodiment. The integrated circuit includes a base plate of a capacitor, and a capacitor insulating layer overlying the base plate. A top plate of the capacitor overlies the capacitor insulating layer, where the top plate has a top plate upper surface. A shield insulated from the base plate extends horizontally from the base plate, bends upward at a shield bend point, and is planar with the top plate upper surface.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

In accordance with various exemplary embodiments described herein, an integrated circuit has a dielectric layer formed over a transistor and a first contact, both formed within an interlayer dielectric. A capacitor trench is formed in the dielectric layer such that the capacitor trench is not directly overlying the transistor. A capacitor base plate is formed within the capacitor trench simultaneously with a base layer via gap overlying a first contact. An organic or inorganic planarization layer is formed overlying the base plate and the transistor, where the planarization layer provides a smooth surface for accurate lithography. A via is formed properly aligned with the base layer via gap and the first contact, where the smooth surface or the planarization layer facilitates accurate alignment of the via. The planarization layer is removed, and a second contact is formed in the via simultaneously with a capacitor top plate overlying the base plate.

Figure 1:
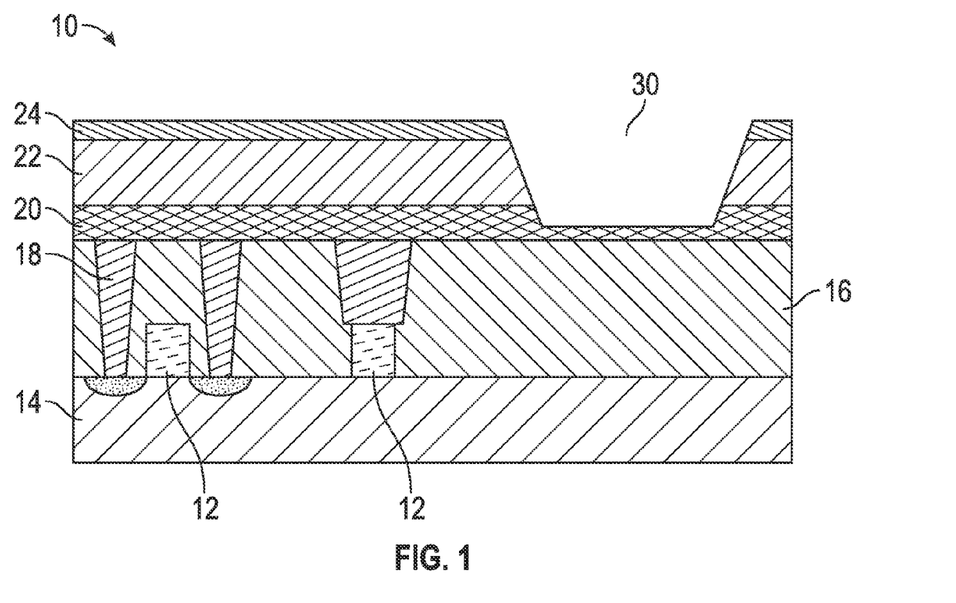
FIGS. 1-13 illustrate, in cross sectional views, a portion of an integrated circuit and methods for its fabrication in accordance with exemplary embodiments.

Referring to the exemplary embodiment illustrated in FIG. 1, an integrated circuit 10 includes an electronic component 12 overlying and optionally within a substrate 14. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate 14. The silicon substrate 14 may be a bulk silicon wafer (as illustrated) or may be a thin layer of silicon on an insulating layer (commonly known as silicon-on-insulator or SOI) that, in turn, is supported by a carrier wafer.

In an exemplary embodiment, the electronic component 12 is a transistor, as illustrated, but in alternate embodiments the electronic component 12 can be a wide variety of other electronic components, such as resistors, capacitors, interconnects, etc. An interlayer dielectric 16 overlies the substrate 14 and the electronic component 12, and a first contact 18 extends through the interlayer dielectric 16 and is electrically connected to the electronic component 12. As used herein, the term "overlying" means "over" such that an intervening layer may lie between the interlayer dielectric 16 and the substrate 14, and "on" such the interlayer dielectric 14 physically contacts the substrate 14. The first contact 18 may be electrically connected to a source, drain, and/or gate of a transistor (as illustrated), or to different electronic components 12. In some embodiments, there are a plurality of first contacts 18, and the plurality of first contacts 18 may make an electrical connection with one or more different electronic components 12. The interlayer dielectric 16 is an insulating material, such as, for example, silicon dioxide, silicon nitride, or the like, and the first contact 18 is an electrically conductive material, such as copper, tungsten, or the like.

A etch stop layer 20 is formed overlying the interlayer dielectric 16 and the first contact 18. The etch stop layer 20 may be silicon nitride, but other materials can also be used. For example, a etch stop layer with the general formula $SiC_xN_yH_z$ is useful in preventing copper migration, such as is common during annealing. A layer of $SiC_xN_yH_z$ can be deposited at about 1-10 Torr of pressure, and a temp of 100-400 degrees centigrade (° C.) using 2,2,5,5,-tetramethyl-2,5-disila-1-azacyclopentane as a precursor. The precursor is a cyclic molecule containing 1 N atom, 2 Si atoms and 2 C atoms in a 5 member ring. Other materials can also be used in the etch stop layer 20.

A dielectric layer 22 is formed overlying the etch stop layer 20. As such, the dielectric layer 22 also overlies the interlayer dielectric 16, the substrate 14, and other components underlying the etch stop layer 20. The dielectric layer 22 is silicon dioxide in an exemplary embodiment, but other electrically insulating materials can also be used. In an exemplary embodiment, silicon dioxide for the dielectric layer 22 is deposited using octamethylcyclotetrasiloxane (OMCTS) as a precursor. Silicon dioxide can be deposited using OMCTS with silane with a plasma provided at about 50 watts (W) to about 3000 W of radio frequency (RF) power at a frequency of about 13.56 MHz and/or 350 KHz. This exposure is followed with an oxygen purge using an oxygen containing gas, such as oxygen gas or nitrous oxide, and a plasma provided at about 50 W to about 3000 W for about 0.1 seconds to about 600 seconds. The OMCTS and purge steps can be repeated until the dielectric layer 22 is at the desired thickness, such as about 50 nanometers to about 500 nanometers. In alternate embodiments, the dielectric layer 22 may be deposited by plasma enhanced chemical vapor deposition using dichlorosilane, silane, or tetraethyl orthosilicate (TEOS) as precursors, or other known lower dielectric constant (K) silicon dioxide deposition techniques.

A first mask layer 24 is optionally formed overlying the dielectric layer 22. In an exemplary embodiment, the first mask layer 24 is silicon dioxide formed using ozone and TEOS as precursors in a chemical vapor deposition at less than atmospheric pressure, but other materials or other methods of forming silicon dioxide can also be used. The first mask layer 24 and the dielectric layer 22 are both electrically insulating materials in many embodiments.

Figure 2:
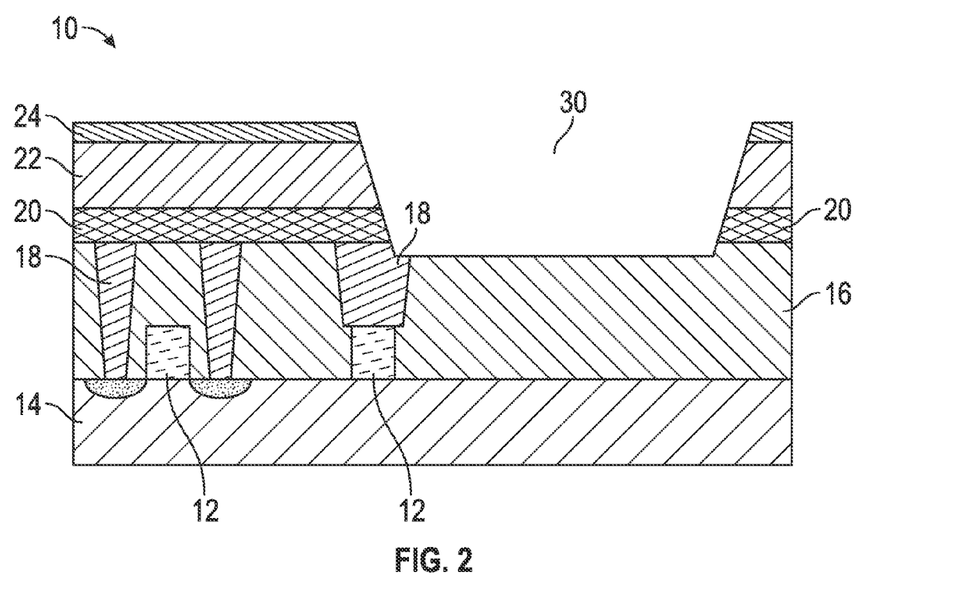

A capacitor trench 30 is formed through the first mask layer 24, if present, and through the dielectric layer 22 to the etch stop layer 20. A layer of photoresist (not illustrated) may be formed and patterned to expose the first mask layer 24 for the capacitor trench 30. The capacitor trench 30 is formed using an etchant selective to the material of the insulating layer, and the first mask layer 24 if present. In an exemplary embodiment with a silicon dioxide dielectric layer 22, the capacitor trench 30 is formed with a reactive ion etch using carbon tetrafluoride, or a combination of the reactive ion etch with a wet etch using hydrofluoric acid, but many other etchants and etch techniques can be used in alternate embodiments. The capacitor trench 30 may stop on top of the etch stop layer 20, or it may extend into the etch stop layer 20 for some distance (as illustrated in FIG. 1), or it may penetrate the etch stop layer 20 in various embodiments. The etch stop layer 20 may function as an etch stop during the formation of the capacitor trench 30. The capacitor trench 30 is formed overlying the substrate 14 and the interlayer dielectric 16, and the capacitor trench 30 is offset from the first contact 18 such that capacitor trench 30 is not directly over the first contact 18. The capacitor trench 30 may overlie one or more electronic components (not illustrated) in some embodiments. An alternate embodiment is illustrated in FIG. 2, where the capacitor trench 30 extends through the etch stop layer 20 and overlies a first contact 18 such that at least a portion of the first contact 18 is exposed in the capacitor trench 30. This embodiment is described in more detail below.

Figure 3:
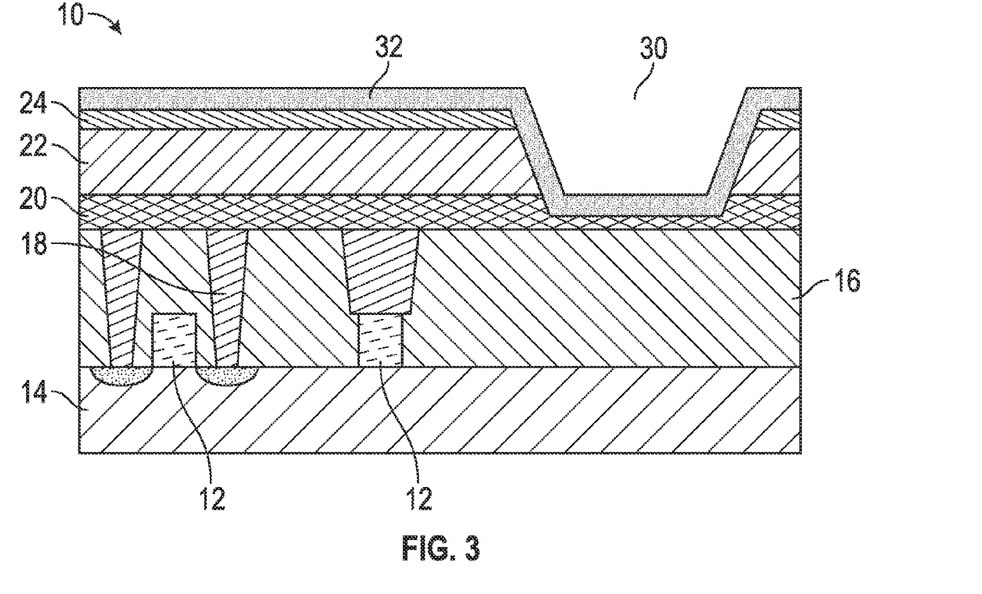

Referring to the exemplary embodiment illustrated in FIG. 3, a base layer 32 is formed overlying the dielectric layer 22 and the first mask layer 24 (if present), and within the capacitor trench 30. The base layer 32 is formed from an electrically conductive material, and may be metallic in some embodiments. In an exemplary embodiment, the base layer 32 is titanium nitride, but other materials can also be used. Titanium nitride can be formed by chemical vapor deposition using tetramethylamidotitanium and nitrogen trifluoride at a pressure of about 0.1 to about 10 torr and a temperature of about 500° C., but other deposition process are also possible. The base layer 32 is conformally deposited in some embodiments.

Figure 4:
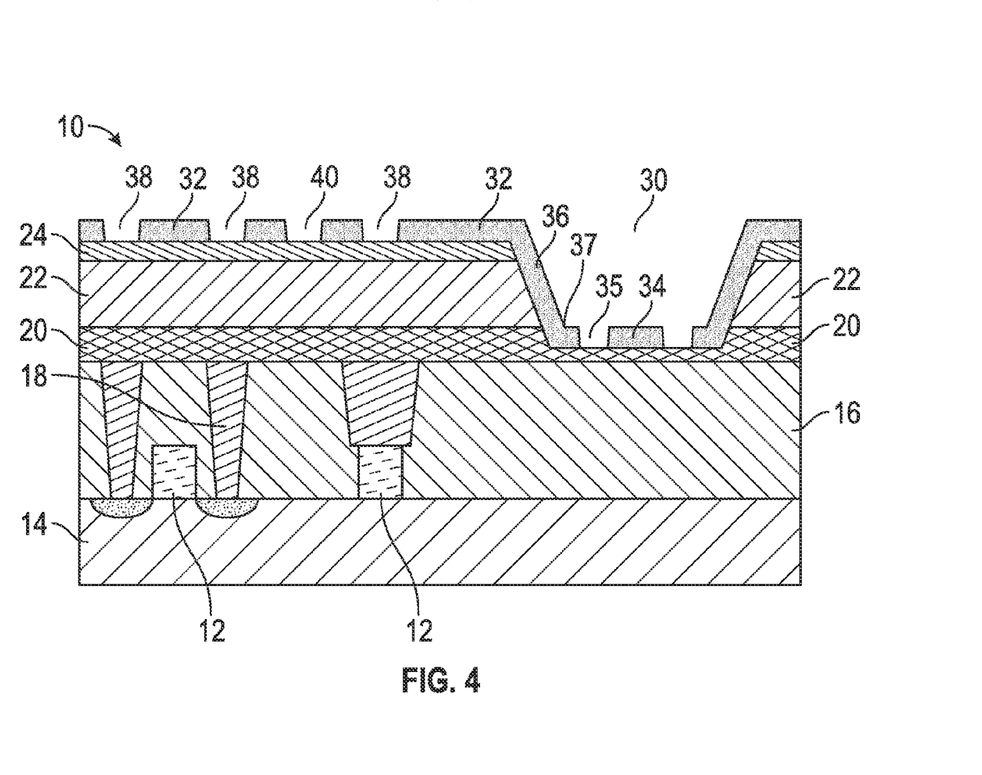

FIG. 4 illustrates the formation of a base plate 34 and a shield 36 from the base layer 32 while simultaneously forming a base layer via gap 38. In an exemplary embodiment, selected portions of the base layer 32 are protected lithographically, and the base layer 32 is removed at desired locations. For example, the base layer 32 may be removed to form the base layer via gap 38 overlying the dielectric layer 22, and to form a base plate gap 35 defined between the base plate 34 and the shield 36. Selected portions of the base layer 32 may be removed with a reactive ion etch. The base plate 34 is positioned within the capacitor trench 30 and along the bottom of the capacitor trench 30, so the shield 36 extends along the side walls of the capacitor trench 30. The shield 36 may extend horizontally from the base plate 34 along the bottom of the capacitor trench 30 for a short distance in some embodiments, and the shield 36 may bend upwards at a shield bend point 37 to extend along the capacitor trench 30 side walls. The base layer via gap 38 may be a plurality of base layer via gaps 38, where the base layer via gap 38 is positioned overlying a first contact 18 such that the base layer via gap 38 is aligned directly over the first contact 18. An interconnect gap 40 may optionally be formed in the base layer 32 simultaneously with the base layer via gap 38, the base plate 34, and the shield 36. The interconnect gap 40 is positioned at a desired location for an interconnect, as described more fully below. The interconnect gap 40 may or may not be positioned over a first contact 18, and the interconnect gap 40 may extend such that it passes over a first contact 18 at some locations and does not pass over a first contact 18 at other locations (not illustrated).

Figure 5:
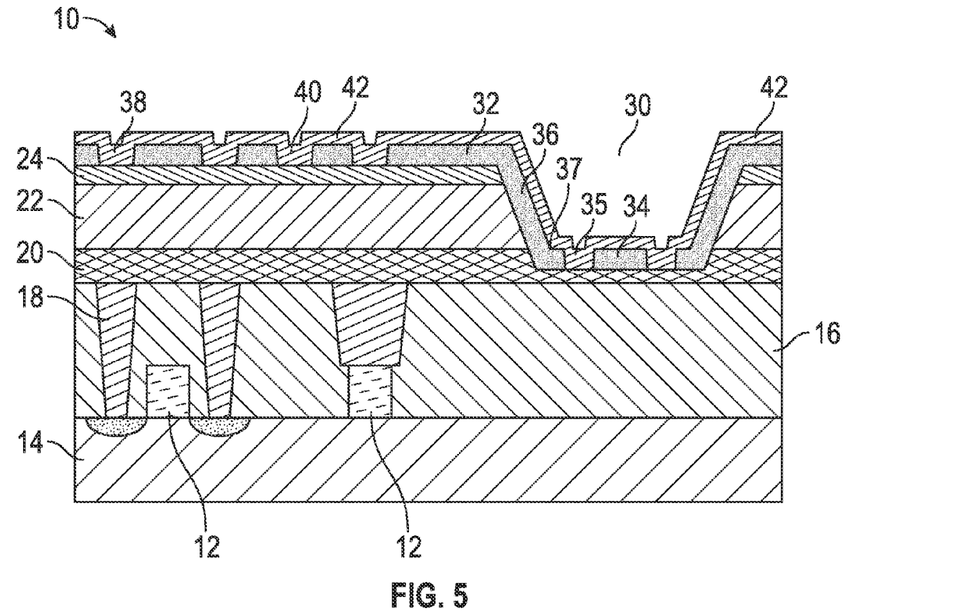

A capacitor insulating layer 42 is formed overlying the base layer 32, the base plate 34, the shield 36, and within the base layer via gap 38, the base plate gap 35, and the interconnect gap 40, as illustrated in FIG. 5. The capacitor insulating layer 42 may be conformally formed from silicon dioxide, which may be deposited using TEOS, as described above. Other insulating materials can be used for the capacitor insulating layer 42 in alternate embodiments. The capacitor insulating layer 42 is formed with a desired thickness and a dielectric constant to provide the desired capacitor performance, as described more fully below. For example, the capacitor insulating layer 42 may have a thickness of from about 5 nanometers to about 50 nanometers in various embodiments.

Figure 6:
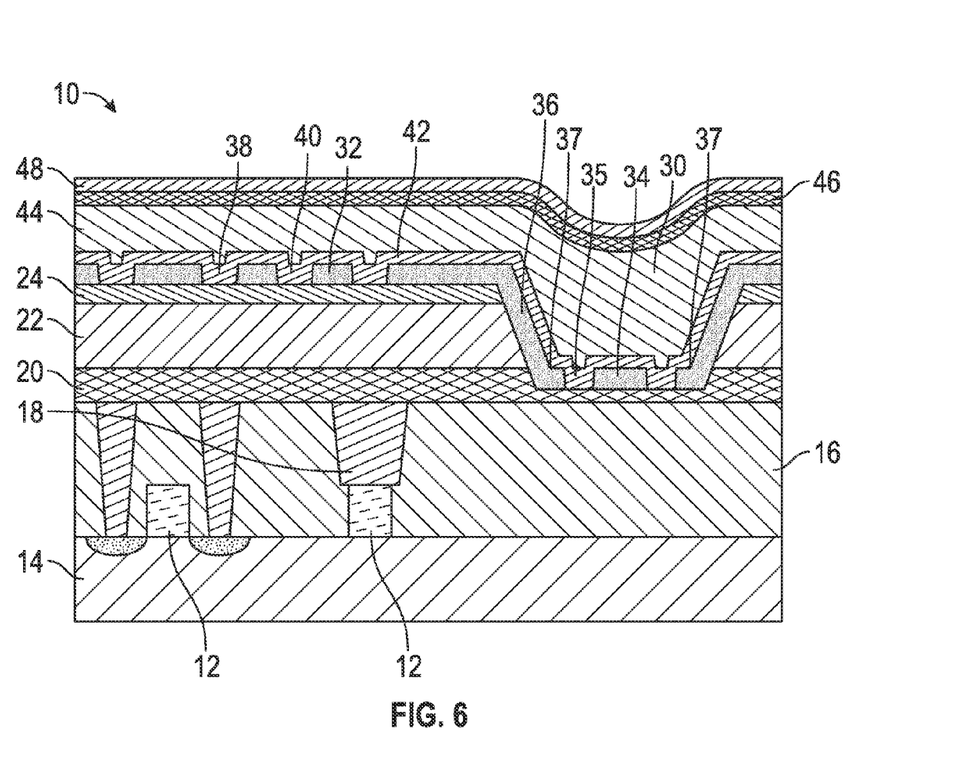

Referring to FIG. 6, a planarization layer 44 is formed overlying the capacitor insulating layer 42. The planarization layer 44 forms a relatively smooth top surface. In an exemplary embodiment, the planarization layer 44 is a polymer, and may be a photoresist such as DUV photoresist or I-line photoresist, which can be deposited by spin coating. In alternate embodiments, the planarization layer 44 may be an inorganic material, as understood by those skilled in the art. A second mask layer 46 is formed overlying the planarization layer 44, and a hard mask 48 is formed overlying the second mask layer 46. In an exemplary embodiment, the second mask layer 46 is silicon dioxide that may be formed by plasma-enhanced chemical vapor deposition using silane and nitrous oxide at a temperature of from about 300° C. to about 400° C. The hard mask 48 may be formed from titanium nitride, which can be deposited as described above. The second mask layer 46 and the hard mask 48 have smooth upper surfaces because they are formed overlying the planarization layer 44.

Figure 7:
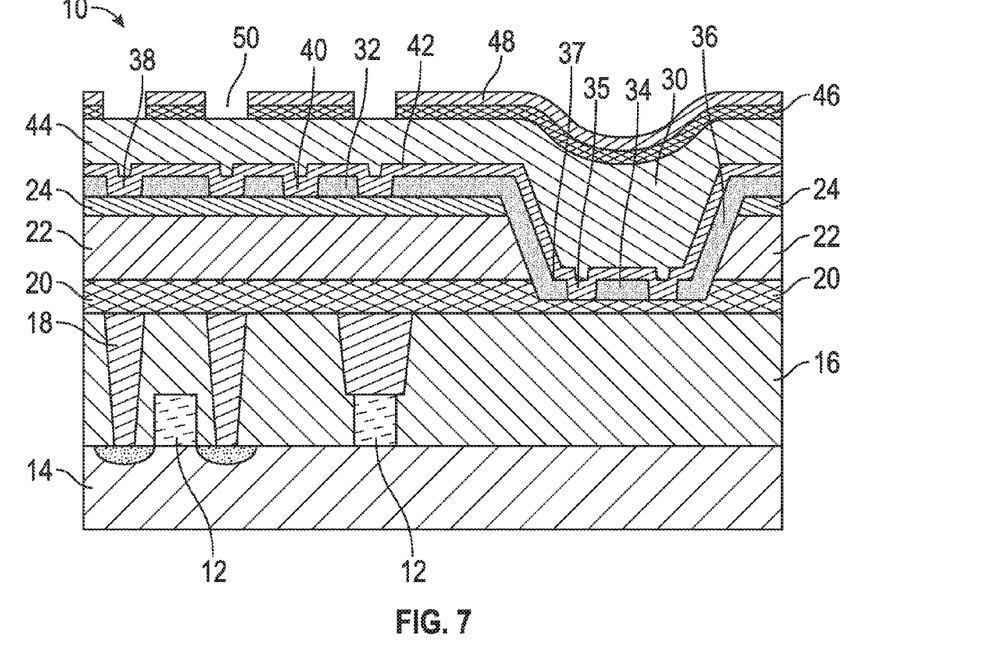

Reference is made to the exemplary embodiment illustrated in FIG. 7. A via 50 is formed through the hard mask 48, where the via 50 overlies the first contact 18, so the via 50 is formed directly over the base layer via gap 38 and the first contact 18. The via 50 is started by lithographically isolating the area of the hard mask 48 at the location of the via 50, and then removing the hard mask 48 from that area, such as with a reactive ion etch. Lithography is more accurate and precise when performed on a flat surface as opposed to a surface that rises and falls. The planarization layer 44 provides a smooth, flat upper surface for the hard mask 48, which improves the lithographic accuracy, as mentioned above. The planarization layer 44 and the overlying areas may not be perfectly flat over the base plate 34, but the surface is smoother and flatter than if the planarization layer 44 had not been used. The hard mask 48 is maintained and remains in place overlying the interconnect gap 40 when the via 50 is formed through the hard mask 48. The second mask layer 46 protects the planarization layer 44 during the etch through the hard mask 48 that initiates the via 50. The via 50 can be extended through the second mask layer 46 after forming the via 50 through the hard mask 48, so the hard mask 48 protects other areas while the via 50 is extended. In an exemplary embodiment, a wet etch with hydrofluoric acid is used to remove the second mask layer 46 and to extend the via 50, but other etchants or etching techniques can also be used.

Figure 8:
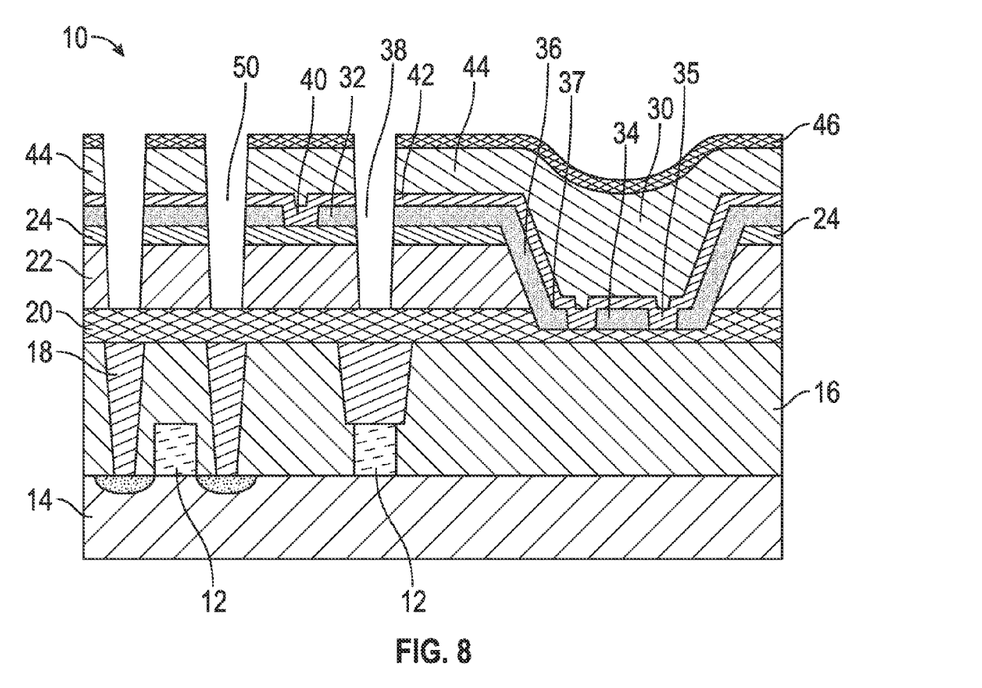

The via 50 is extended through the planarization layer 44, the capacitor insulating layer 42, through the base layer via gap 38 in the base layer 32, the first mask layer 24, and the dielectric layer 22, until the via 50 terminates at the etch stop layer 20, as illustrated in an exemplary embodiment in FIG. 8. The base layer via gap 38 is the space previously formed in the base layer 32 and over the first mask layer 24, which was later filled with the capacitor insulating layer 42, so the via 50 passes through the previously formed space in the base layer 32. The via 50 can be extended with one or more anisotropic etches, where the hard mask 48 is resistant to the anisotropic etch such that the hard mask 48 remains in place. In an exemplary embodiment, the via 50 is extended with a reactive ion etch using carbon tetrafluoride, but other etchants are used in other embodiments. In some embodiments, the via 50 may be extended using a plurality of etches, where the etchant and the etching technique are selected for the layer or layers being etched. In an exemplary embodiment, reactive ion etches are used, and the hard mask 48 illustrated in FIG. 7 may also be removed at this time by the reactive ion etches.

Figure 9:
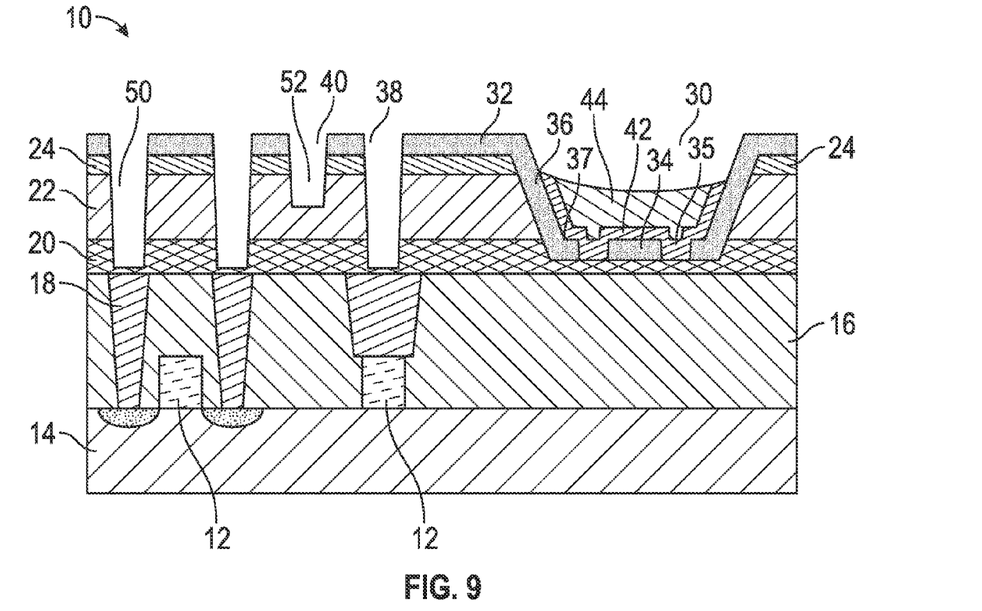

Reference is made to the exemplary embodiment illustrated in FIG. 9. The hard mask 48 was removed, as described above. The planarization layer 44 is then removed from over the capacitor insulating layer 42, but the planarization layer 44 remains within the bottom portion of the capacitor trench 30. The planarization layer 44 forms a thicker layer within the capacitor trench 30, and a blanket reactive ion etch can be used to remove a consistent thickness of material from all areas. The blanket reactive ion etch can be timed to leave a portion of the planarization layer 44 within the capacitor trench 30 while removing the thinner portions of the planarization layer 44 outside of the capacitor trench 30. An interconnect trench 52 is formed after the planarization layer 44 is removed, where the interconnect trench 52 extends through the interconnect gap 40 in the base layer 32. The interconnect trench 52 extends into the dielectric layer 22, but does not penetrate the dielectric layer 22 to reach the etch stop layer 20, so a portion of the dielectric layer 22 separates the interconnect trench 52 from the etch stop layer 20. The interconnect trench 52 is formed after the planarization layer 44 is removed, such as by a reactive ion etch. The interconnect trench 52 is formed through the interconnect gap 40, and etch stop layer 20 at the bottom of the via 50 may be about 90 percent removed during this etch step. The capacitor insulating layer 42 is removed where it is not covered by the remaining planarization layer 44 (which is outside of the bottom of the capacitor trench 30) as the interconnect trench 52 is formed.

Figure 10:
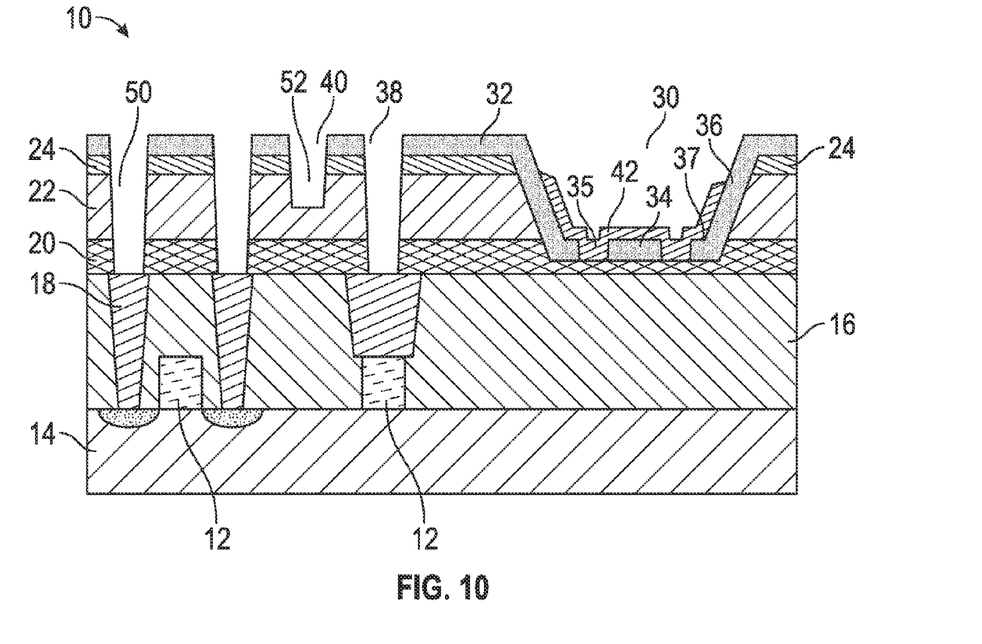

Referring to the exemplary embodiment illustrated in FIG. 10, the via 50 is further extended through the etch stop layer 20 such that a top portion of the first contact 18 is exposed through the via 50. The via 50 can be extended through the etch stop layer 20 with an etch selective to the etch stop layer 20, such as a reactive ion etch using trifluoromethane. An etchant that preferentially etches the etch stop layer 20 over the base layer 32 is used, so the base layer 32 protects other components during the etching process. The planarization layer 44 that remained at the bottom of the capacitor trench 30 is removed by the etch that extends the via 50 through the etch stop layer 20, but the capacitor insulating layer 42 remains at the bottom of the capacitor trench 30.

Figure 11:
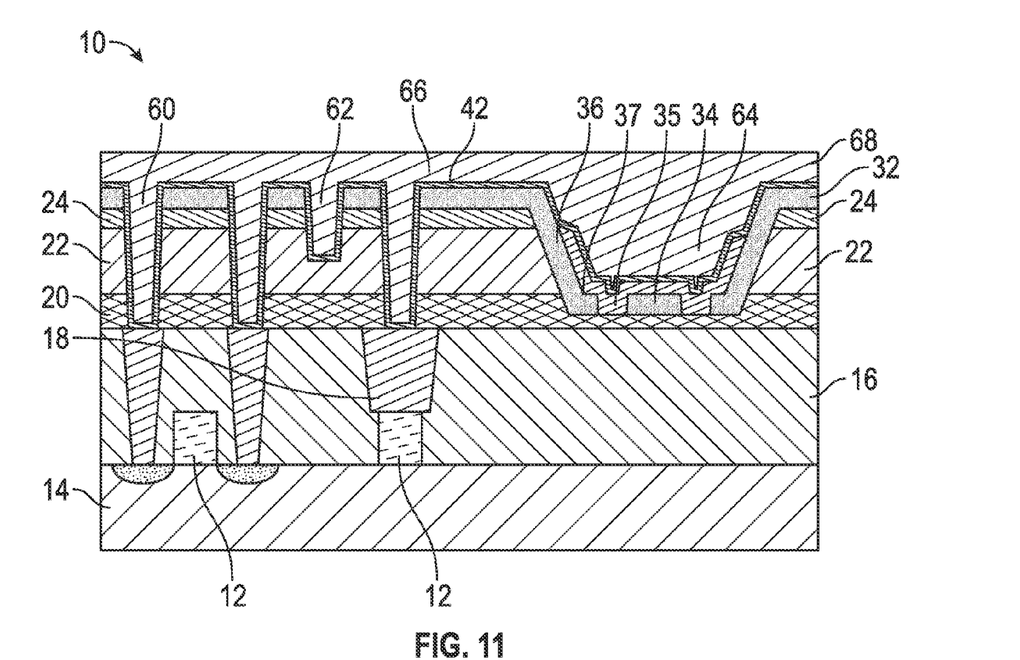

A second contact 60, an interconnect 62, and a top plate 64 are simultaneously formed, as illustrated in an exemplary embodiment in FIG. 11 with continuing reference to FIG. 10. The second contact 60 is formed in the via 50, the interconnect 62 is formed in the interconnect trench 52, and the top plate 64 is formed in the capacitor trench 30 overlying the capacitor insulating layer 42 and the base plate 34. The second contact 60, interconnect 62, and top plate 64 are formed of a conductive material, and in an exemplary embodiment that conductive material is metallic. For example, the second contact 60, interconnect 62, and top plate 64 may include copper, but other metals or other conductive materials are used in alternate embodiments. One technique for forming the second contact 60, interconnect 62, and top plate 64 from copper includes the damascene or dual damascene process. In an exemplary embodiment, a barrier metal and seed layer 66 is formed overlying the exposed surfaces, and then a core 68 is formed overlying the barrier metal and seed layer 66. The barrier metal and seed layer 66 may improve adhesion of the core 68 to dielectric materials and thereby improve reliability. The barrier metal and seed layer 66 may be formed of copper and manganese deposited by physical vapor deposition using copper amidinate and manganese amidinate. In alternate embodiments, the barrier metal and seed layer 66 may be formed from titanium, titanium nitride, or other materials. The core 68 may then be deposited, such as by electroplating. The core 68 may be about 90 mass percent or more copper in some embodiments, and various copper alloys can be used, some of which include less than 90 mass percent copper. The second contact 60 forms an electric connection with the first contact 18.

Figure 12:
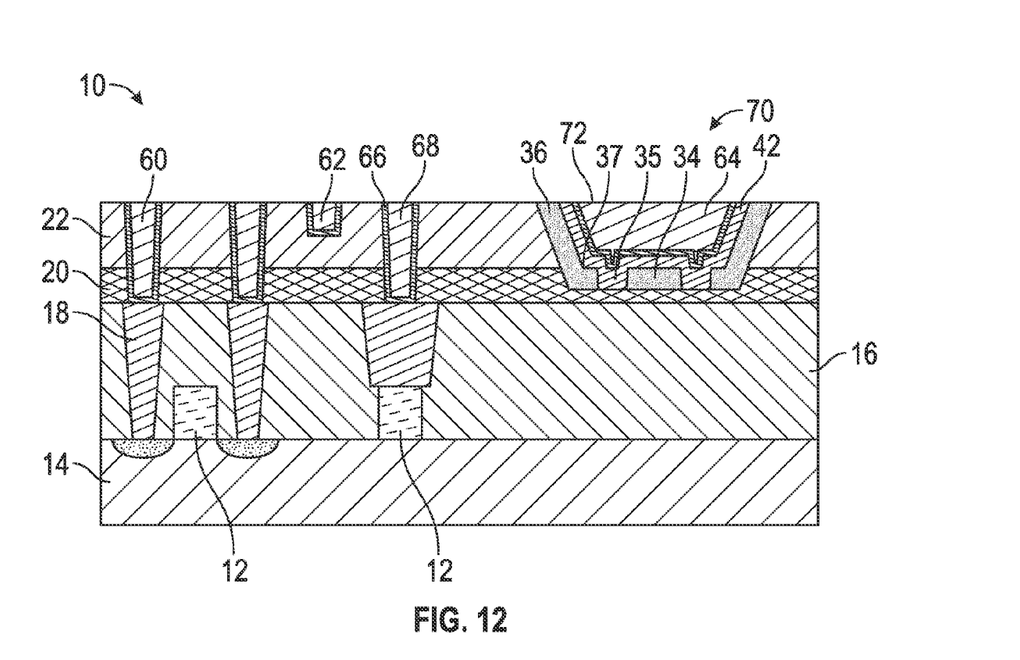

The overburden and excess material is removed, such as by chemical mechanical planarization, as illustrated in an exemplary embodiment in FIG. 12 with continuing reference to FIG. 10. In an exemplary embodiment, the capacitor insulating layer 42, the base layer 32, and the first mask layer 24 are removed in the areas outside of the capacitor trench 30, and overburden is removed in the area overlying the capacitor trench 30. As such, the top plate 64 is planarized to a desired thickness, and a top plate upper surface 72 is planar with an upper surface of the dielectric layer 22, the second contact 60, and the interconnect 62. The planarization removes excess material from the shield 36, so the shield 36 is planar with the top plate upper surface 72. The top plate 64 and the base plate 34 are separated by the capacitor insulating layer 42, and this structure forms a capacitor 70. The size of the top plate 64 and the base plate 34 as well as the thickness and dielectric constant of the capacitor insulating layer 42 partially determine the electrical performance characteristics of the capacitor 70, and these properties are determined during the manufacturing process. The shield 36 forms a barrier to reduce electrical and magnetic noise that would otherwise reach the capacitor 70, so the shield 36 is electrically isolated or insulated from the base plate 34 and the capacitor 70 by the capacitor insulating layer 42. In some embodiments, the shield 36 extends horizontally from the base plate 34 and bends upwards at a shield bend point 37, as mentioned above. The interconnect 62 may be electrically isolated within the dielectric layer 22 to avoid unwanted electrical shorts. The second contact 60 is electrically connected to the first contact 18, and these components can be incorporated into an integrated circuit 10 using techniques and methods known to those skilled in the art. The simultaneous formation of the second contact 60, the interconnect 62, and the top plate 64 of the capacitor 70 reduces the number of manufacturing steps over process that form these components separately.

Figure 13:
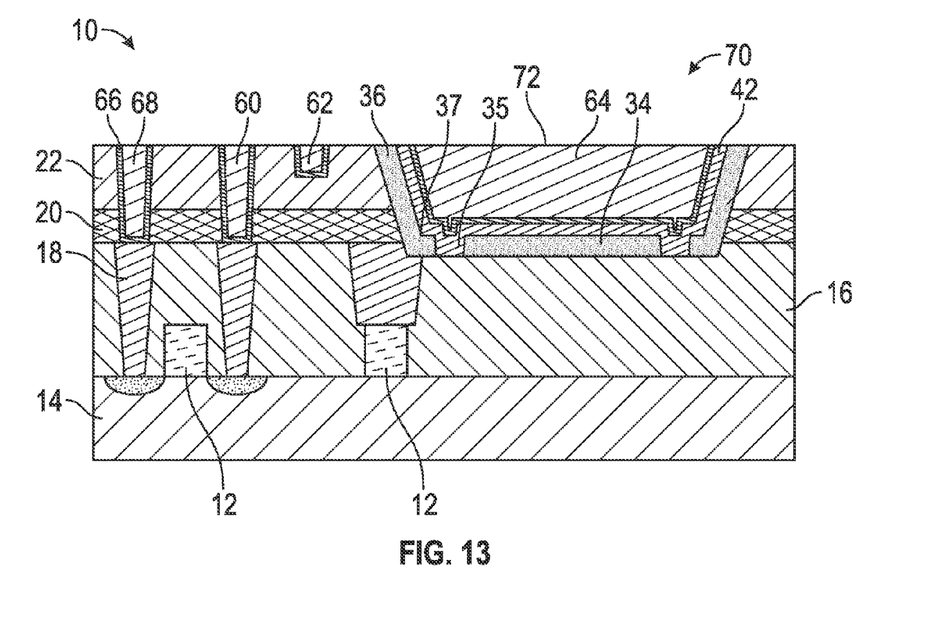

Referring to an exemplary embodiment in FIG. 13, and referring again to FIG. 2, the capacitor trench 30 may have been formed to expose a portion of a first contact 18, as described above. Proceeding as described above from the embodiment illustrated in FIG. 2 produces the embodiment illustrated in FIG. 13, so the base layer 32 is formed in electrical contact with the first contact 18. The base plate gap 35 is formed overlying the dielectric layer 22 such that the shield 36 is electrically connected with the first contact 18 and the base plate 34 is electrically isolated from the first contact 18. In this embodiment, the first contact 18 can be used to provide a desired potential or a ground to the shield 36 to better protect the capacitor 70 from unwanted electrical or magnetic noise.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a capacitor trench through a dielectric layer;
   forming a base layer overlying the dielectric layer and within the capacitor trench;
   forming a base layer via gap in the base layer, wherein the base layer via gap is positioned overlying the dielectric layer and a first contact, wherein the dielectric layer overlies the first contact;
   forming a base plate and a shield from the base layer, wherein the base plate is positioned within the capacitor trench;
   forming a capacitor insulating layer overlying the base plate, the base layer, and within the base layer via gap;
   forming a via through the base layer via gap; and
   simultaneously forming a second contact and a top plate, wherein the second contact is formed in the via and the top plate is formed in the capacitor trench.

2. The method of claim 1 wherein forming the base plate and the shield comprise:
   forming a base plate gap defined between the base plate and the shield, wherein the base plate gap is formed simultaneously with the base layer via gap.

3. The method of claim 1 further comprising:
   forming a planarization layer overlying the capacitor insulating layer before forming the via, wherein the planarization layer comprises an organic material.

4. The method of claim 1 wherein forming the top plate comprises:
   forming the top plate from a conductive material, wherein the top plate overlies the base plate; and
   planarizing the conductive material of the top plate such that the shield is planar with a top plate upper surface.

5. The method of claim 1 further comprising:
removing a etch stop layer from overlying the first contact prior to forming the second contact within the via such that the second contact is in electrical connection with the first contact, wherein the dielectric layer overlies the etch stop layer.

6. The method of claim 1 wherein:
forming the capacitor trench comprises forming the capacitor trench through a etch stop layer underlying the dielectric layer such that the first contact is exposed within the capacitor trench;
forming the base layer comprises forming the base layer in electrical contact with the first contact; and
forming the base plate and the shield comprises forming the shield in electrical contact with the first contact.

7. The method of claim 1 wherein:
forming the second contact comprise forming the second contact wherein the second contact comprises copper; and
forming the top plate comprises forming the top plate wherein the top plate comprises copper.

8. The method of claim 1 wherein forming the shield comprises forming the shield wherein the shield extends horizontally from the base plate and bends upwards at a shield bend point.

9. The method of claim 3 further comprising:
forming an interconnect gap in the base layer while forming the base layer via gap.

10. The method of claim 9 further comprising:
forming an interconnect trench in the dielectric layer after forming the via to the etch stop layer.

11. The method of claim 10 further comprising:
removing the planarization layer before forming the interconnect trench; and
forming an interconnect within the interconnect trench while forming the second contact in the via.

12. A method of producing an integrated circuit comprising:
forming a capacitor trench through a dielectric layer;
forming a base layer overlying the dielectric layer and within the capacitor trench;
removing the base layer at a base plate gap within the capacitor trench to form a base plate and a shield from the base layer, wherein the base plate gap is defined between the base plate and the shield, wherein the shield is electrically isolated from the base plate, and wherein the shield extends horizontally from the base plate and bends at a shield bend point;
forming a capacitor insulating layer overlying the base plate and the base layer; and
forming a top plate overlying the base plate, wherein the capacitor insulating layer is positioned between the top plate and the base plate.

13. The method of claim 12 wherein forming the base layer comprises forming the base layer from an electrically conductive material.

14. The method of claim 12 wherein forming the base layer comprises forming the base layer wherein the base layer comprises titanium nitride.

15. The method of claim 12 further comprising:
forming a second contact in a via extending through the dielectric layer while forming the top plate.

16. The method of claim 12 further comprising:
forming an interconnect in the dielectric layer while forming the top plate.

17. The method of claim 12 wherein forming the capacitor insulating layer comprises conformally depositing silicon dioxide overlying the base layer.

18. The method of claim 12 further comprising:
planarizing the top plate such that the shield is planar with a top plate upper surface.

19. The method of claim 15 further comprising:
forming a planarization layer overlying the capacitor insulating layer;
forming a hard mask overlying the planarization layer; and
forming the via through the hard mask and the dielectric layer.

20. An integrated circuit comprising:
a base plate of a capacitor;
a capacitor insulating layer overlying the base plate;
a top plate of the capacitor overlying the capacitor insulating layer, wherein the top plate comprises a top plate upper surface;
a shield insulated from the base plate, wherein the shield extends horizontally from the base plate, bends upward at a shield bend point, and is planar with the top plate upper surface.

* * * * *